April 13, 1965 W. G. TINKELENBERG 3,178,214

EXTRACTOR FOR REMOVING PRINTED CIRCUIT BOARDS FROM A RACK

Filed July 30, 1963

INVENTOR
WILLIAM G. TINKELENBERG
BY Warren F.B. Lindsley
ATTORNEY

United States Patent Office 3,178,214
Patented Apr. 13, 1965

3,178,214
EXTRACTOR FOR REMOVING PRINTED CIRCUIT BOARDS FROM A RACK

William G. Tinkelenberg, Phoenix, Ariz., assignor to General Electric Company, a corporation of New York Filed July 30, 1963, Ser. No. 298,729
3 Claims. (Cl. 294—15)

This invention relates to tools and more particularly to a dual purpose tool for extracting printed circuit boards from a high density packed rack and replacing the printed circuit boards in the rack against the closing-in pressures of a plurality of frictional contacts.

Racks have been used for providing a package for a plurality of parallel arranged printed circuit boards. These printed circuit boards may be stacked in the rack in space increments of any suitable size. The spacings between the boards, however, are usually small enough so as to render it difficult, if not impossible, to remove the boards from the racks without a tool, particularly in view of the force necessary to overcome the frictional contacts connecting the board to the wiring associated with the rack.

In the past, flexible loops or handles have been attached to each board to aid in its removal from the rack. These loops and handles are not only expensive when added, for example, to every circuit board of a computer or radar installation but are not entirely satisfactory since it is becoming increasingly difficult to remove the boards from the racks without some form of force multiplying means. Thus, a printed circuit board extractor is needed which will readily grasp a board in a closely packed rack of printed circuit boards and force it out of frictional contact with the finger contacts of the rack through lever action so that it may be readily removed from the rack by an operator. Further, the extractor must be usable for forcing printed circuit boards back into the rack in frictional contact with the finger contacts of the rack.

It is, therefore, one object of this invention to provide a new and improved tool for removing printed circuit boards or cards from a rack.

Another object of this invention is to provide a new and improved printed circuit board extractor which utilizes the principles of a lever in extracting the cards from the rack.

A further object of this invention is to provide a new and improved dual purpose extractor in which the extractor is utilized in removing printed circuit boards from and replacing them in a rack.

Other objects and advantages of this invention will become apparent from the following description when taken in connection with the accompanying drawing in which.

Figures 1, 2, 3, 4:
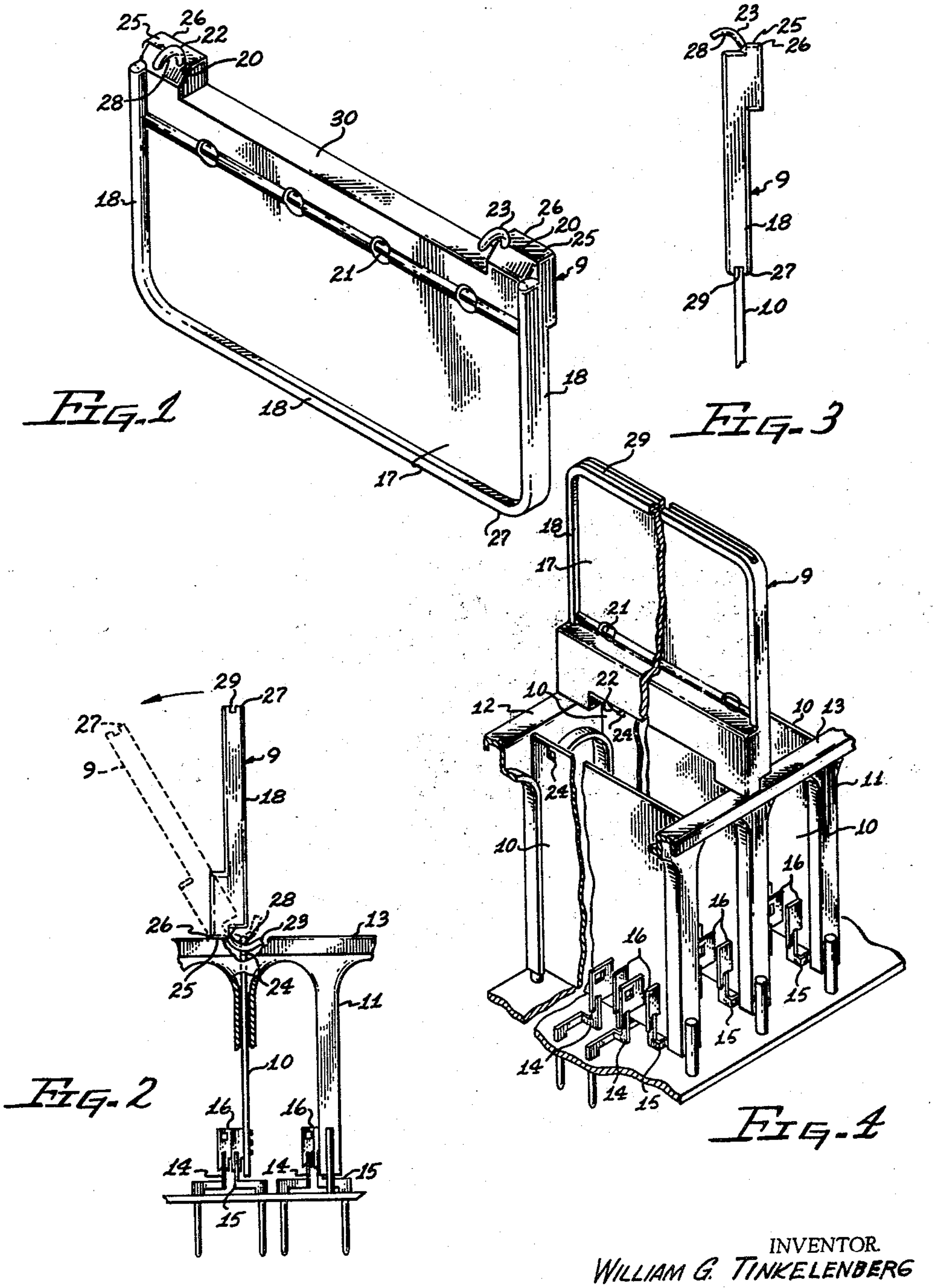
FIG. 1 is a perspective view of a tool used for removing from and replacing printed circuit boards in a rack and embodying the invention.
FIG. 2 illustrates in full lines an end view of the structure shown in FIG. 1 in position on a rack for removing a printed circuit board from its contact engaged position and in dashed lines its position after it has actuated the printed circuit board to its contact disengaged position.
FIG. 3 is an end view of the tool shown in FIG. 1 in engagement with a printed circuit board for pushing the printed circuit board into contact engaged position in the rack.
FIG. 4 is a partial perspective view of a rack for printed circuit boards showing the tool mounted on the sides of the rack in position for actuating a printed circuit board to its contact disengaged position.

In accordance with the invention claimed, a new and improved dual purpose tool is provided for removing cards such as printed circuit boards from a rack or container which is designed to hold a plurality of these cards in a closely packed parallel arrangement. This tool, which may be called an extractor, comprises a body member having an edge for extending across the sidewalls of the container. Hooklike members are arranged to extend outwardly from this edge for attachment to apertures in the card in the container. Means are provided on the extractor and spaced laterally from the card attachment means for providing pivot points for rotating the extractor as a lever through a given angle on the edges of the sidewalls of the container. The extractor, upon rotation about its pivot points on the edges of the sidewalls of the container, moves the card outwardly of the container. The same extractor is provided with a grooved edge on the opposite side of its body member for use in engaging the card and pushing it back into its contact engaged position in the container.

Referring more particularly to the drawing by characters of reference, FIGS. 1–4 disclose an extractor 9 for removing printed circuit boards or cards 10 from a container or rack 11. The rack may be of any suitable size or shape but is defined as comprising a pair of spaced sidewalls 12 and 13 which define pathways for the edges of the cards to expedite loading and unloading of the cards into and from the racks. The cards which may be of any size are provided with contacts for interlocking with mating contacts in the rack. These contacts fit tightly together in a friction type interlocking arrangement requiring a given amount of effort to force the contacts together and also a given amount of effort to separate the contacts upon removal of the cards from the rack.

FIGS. 2 and 4 illustrate one form of mating contacts wherein the relative stationary contacts mounted on the base of the rack comprise a pair of spaced contact portions 14 and 15 which receive between them in a tight interlocking frictional fit a relatively movable contact portion 16 mounted on card 10.

In accordance with the invention claimed, a new and improved card extractor is provided and as shown more clearly in FIGS. 1 and 3 comprises a body member 17 formed preferably of a suitable insulating material such as a plastic which may be molded into any suitable shape such as the shape shown in the drawings. Three of the four edges of body member 17 are provided with flanges 18 protruding from both of its plane surfaces.

Edge 20 of body member 17 is provided with means extending outwardly from the body member for engaging and attaching to a printed circuit board or card. As shown in the drawing, this engaging and attaching means comprises a U-shaped member 21 molded into body member 17 and so arranged that the ends thereof extend outwardly of edge 20 in hook-shaped configurations. The ends of the hook-shaped configurations 22, 23 when edge 20 of the extractor is mounted across the sidewalls of rack 12 are arranged to protrude through a pair of apertures 24 in cards 10.

In accordance with the invention claimed, extractor 9 is provided with a pair of pivot means spaced laterally from the plane formed by the legs of the U-shaped member 21. These pivot means may be separate structural elements attached to body member 17 so as to lie adjacent to but spaced from edge 20. The structure shown in the drawing forming these pivot points, however, comprises a flange 25 arranged to extend laterally from edge 20. The pivot points in this instance comprise the outward edge 26 of flange 25 which is spaced laterally a given distance from the legs and more particularly from the card engaging points 28 of U-shaped member 21.

As shown in FIGS. 2 and 4, the hook ends of U-shaped member 21 are arranged to pass through apertures 24 in cards 10 when the extractor is positioned transversely across the edges of the sidewalls of rack 11. Upon rotation of the extractor counterclockwise as shown in FIG. 2 about its pivot points or fulcrum on the edge 26 of flange 25, card 10 is actuated axially along the pathways in rack 11 a predetermined distance causing disengagement of contact portions 14 and 15 from contact portion 16. The card then may be moved axially out of the rack by means of the extractor or manually by the operator. The amplification of the force applied to the card by the extractor or lever is determined by the ratio of the distance from edge 26 of flange 25 to end 27 of body member 17 and the distance from edge 26 to the card engaging points 28 of U-shaped member 21.

In order to aid in forcing the cards back into contact engaged position in the rack, a groove 29 is formed in end 27 of body member 17. To force a card into contact engaged position, the card is merely inserted in the desired pathway of rack 11 and the grooved end 27 of the extractor is attached to the card in the manner shown in FIG. 3. The card is then pushed into contact engaged position by the operator using surface 30 of the cutout portion of flange 25 of edge 20 of the extractor as the pressure applying surface of the tool.

While the principles of the invention have now been made clear in an illustrative embodiment, there will be immediately obvious to those skilled in the art many modifications in structure, arrangement, proportions, the elements, materials, and components, used in the practice of the invention, and otherwise, which are particularly adapted for specific environment and operating requirements, without departing from those principles. The appended claims are therefor intended to cover and embrace any such modifications, within the limits only of the true spirit and scope of the invention.

What is claimed as new and desired to secure by Letters Patent of the United States is:

1. An extractor for removing cards from a container having a pair of spaced sidewalls defining pathways for receiving edge surfaces of cards, said extractor including a body member comprising a substantially flat main portion and a projecting portion at one end of said main portion which extends from the plane of said main portion and beyond the end of said main portion in a plane parallel to the plane of said main portion, card engaging means secured to a first edge of the projecting portion of said body member, said engaging means extending transversely of and in spaced relationship to the adjacent edge surface of the main portion of said body member, a second edge of the projecting portion spaced from said first edge contacting the spaced sidewalls of a container to provide pivot points about which the extractor may be rotated to remove a card from a container.

2. An extractor for removing cards from a container having a pair of spaced sidewalls defining pathways for receiving edge surfaces of cards, said extractor including a body member comprising a substantially flat main portion and a projecting portion at one end of said main portion which extends from the plane of said main portion and beyond the end of said main portion in a plane parallel to the plane of said main portion, a pair of hooklike members secured to a first edge of the projecting portion of said body member, said pair of hooklike members extending transversely of and in spaced relationship to the adjacent edge surface of the main portion of said body member for engaging a pair of spaced apertures in a card, a second edge of the projecting portion spaced from said first edge contacting the spaced sidewalls of a container to provide pivot points about which the extractor may be rotated to remove a card from a container.

3. A tool for inserting cards in and for removing cards from a container having a pair of spaced sidewalls defining pathways for receiving edge surfaces of cards, said extractor including a body member comprising a substantially flat main portion and a projecting portion at one end of said main portion which extends from the plane of said main portion and beyond the end of said main portion in a plane parallel to the plane of said main portion, the edge surface of said main portion of said body member opposite said one end being provided with a groove for receiving an edge of a card, a pair of hooklike members secured to a first edge of the projecting portion of said body member, said pair of hooklike members extending transversely of and in spaced relationship to the adjacent edge surface of the main portion of said body member for engaging a pair of spaced apertures in a card, a second edge of the projecting portion spaced from said first edge contacting the spaced sidewalls of a container to provide pivot points about which the extractor may be rotated to remove a card from a container, said tool when engaging a card by means of said pair of hooklike members and rotated about the pivot points through a given arc moving the card outwardly of a container along the pathway defined by the sidewalls of a container, said tool being employed to push a card into a container when said groove in the edge surface of said main portion of said body member engages an edge of a card.

References Cited by the Examiner

UNITED STATES PATENTS

| | | | |
|---|---|---|---|
| 2,618,183 | 11/52 | Cooke | 294—15 X |
| 2,893,777 | 7/59 | O'Neill | 294—1 |

SAMUEL F. COLEMAN, *Primary Examiner.*

WILLIAM B. LA BORDE, *Examiner.*